(12) United States Patent
Diep et al.

(10) Patent No.: US 11,990,885 B2
(45) Date of Patent: May 21, 2024

(54) METHOD FOR MANUFACTURING ACOUSTIC DEVICES WITH IMPROVED PERFORMANCE

(71) Applicant: Qorvo US, Inc., Greensboro, NC (US)

(72) Inventors: Buu Quoc Diep, Murphy, TX (US);
Derya Deniz, McKinney, TX (US);
Matthew L. Wasilik, Plano, TX (US);
John Belsick, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 401 days.

(21) Appl. No.: 17/361,698

(22) Filed: Jun. 29, 2021

(65) Prior Publication Data
US 2022/0416744 A1     Dec. 29, 2022

(51) Int. Cl.
| | |
|---|---|
| *H03H 3/02* | (2006.01) |
| *H03H 9/02* | (2006.01) |
| *H03H 9/13* | (2006.01) |

(52) U.S. Cl.
CPC .......... *H03H 3/02* (2013.01); *H03H 9/02015* (2013.01); *H03H 9/0211* (2013.01); *H03H 9/02157* (2013.01); *H03H 9/131* (2013.01)

(58) Field of Classification Search
CPC .... H03H 3/02; H03H 9/02015; H03H 9/0211; H03H 9/02157; H03H 9/131
See application file for complete search history.

(56) References Cited

U.S. PATENT DOCUMENTS

| | | |
|---|---|---|
| 2005/0035828 A1 | 2/2005 | Kyoung et al. |
| 2010/0252526 A1 | 10/2010 | Obernhuber et al. |
| 2014/0132117 A1* | 5/2014 | Larson, III ............. H03H 9/175 204/192.1 |

(Continued)

FOREIGN PATENT DOCUMENTS

| | | |
|---|---|---|
| EP | 1124269 A2 | 8/2001 |
| EP | 1124269 A3 | 4/2005 |

(Continued)

OTHER PUBLICATIONS

Auger et al. "Growth dynamics of reactive-sputtering-deposited AlN films" Journal of Applied Physics, vol. 97, No. 12, 2005, 8 pages.

(Continued)

*Primary Examiner* — Quan Tra
(74) *Attorney, Agent, or Firm* — Withrow & Terranova, P.L.L.C.

(57) ABSTRACT

A method for manufacturing an acoustic device includes providing a substrate, providing a bottom electrode over the substrate, providing a sacrificial layer on the bottom electrode, patterning the bottom electrode and the sacrificial layer, polishing the sacrificial layer such that a portion of the sacrificial layer remains on the bottom electrode, and removing the remaining portion of the sacrificial layer via a cleaning process such that a surface roughness of the bottom electrode is maintained. By performing the polishing such that a portion of the sacrificial layer remains on the bottom electrode and subsequently removing that portion of the sacrificial layer via a cleaning process that maintains the surface roughness of the bottom electrode, the subsequent growth of a piezoelectric layer on the bottom electrode can be substantially improved.

20 Claims, 14 Drawing Sheets

(56) References Cited

U.S. PATENT DOCUMENTS

| | | | |
|---|---|---|---|
| 2017/0054429 A1* | 2/2017 | Fattinger | ............ H03H 9/02118 |
| 2018/0175826 A1* | 6/2018 | Sadhu | .................... H03H 9/605 |
| 2019/0296710 A1 | 9/2019 | Deniz et al. | |
| 2019/0326880 A1* | 10/2019 | Figueredo | .............. H03H 9/173 |
| 2020/0177158 A1* | 6/2020 | Tag | .......................... H03H 9/54 |

FOREIGN PATENT DOCUMENTS

| | | |
|---|---|---|
| EP | 1901426 A1 | 3/2008 |
| WO | 2009023098 A2 | 2/2009 |
| WO | 2009023098 A3 | 5/2009 |

OTHER PUBLICATIONS

Barranco et al. "Perspectives on oblique angle deposition of thin films: From fundamentals to devices" Progress in Materials Science, vol. 76, 2016, pp. 59-153.

Ramezani et al. "Growth of C-Axis Textured AlN Films on Vertical Sidewalls of Silicon Micro-Fins" IEEE Transactions on Ultrasonics, Ferroelectrics, and Frequency Control, vol. 68, No. 3, 2020, 6 pages.

Extended European Search Report for European Patent Application No. 22172414.9, dated Nov. 28, 2022, 9 pages.

\* cited by examiner

METHOD FOR MANUFACTURING ACOUSTIC DEVICES WITH IMPROVED PERFORMANCE

FIELD OF THE DISCLOSURE

The present disclosure is related to acoustic devices, and in particular to acoustic devices with improved performance and methods for manufacturing the same.

BACKGROUND

Acoustic devices include a piezoelectric layer in electrical contact with one or more electrodes. The performance of an acoustic device is in large part determined by the properties of the piezoelectric layer. These properties may include an orientation of the crystalline structure of the piezoelectric layer. Depositing a piezoelectric layer having a particular crystallographic orientation presents a large technical challenge. Using conventional processes, it has often been difficult to provide a piezoelectric layer having a desired crystallographic orientation. Accordingly, there is a need for acoustic devices having a piezoelectric layer with a precisely defined crystallographic orientation and methods for manufacturing the same.

SUMMARY

In one embodiment, a method for manufacturing an acoustic device includes providing a substrate, providing a bottom electrode over the substrate, providing a sacrificial layer on the bottom electrode, patterning the bottom electrode and the sacrificial layer, polishing the sacrificial layer such that a portion of the sacrificial layer remains on the bottom electrode, and removing the remaining portion of the sacrificial layer via a cleaning process such that a surface roughness of the bottom electrode is maintained. By performing the polishing such that a portion of the sacrificial layer remains on the bottom electrode and subsequently removing that portion of the sacrificial layer via a cleaning process that maintains the surface roughness of the bottom electrode, the subsequent growth of a piezoelectric layer on the bottom electrode can be substantially improved.

In one embodiment, an acoustic device includes a substrate, a bottom electrode, a seed layer, a piezoelectric layer, and a top electrode. The bottom electrode includes a top surface, which has a roughness between 0.3 nm average roughness (Ra) and 2 nm Ra. The seed layer is on the top surface of the bottom electrode. The piezoelectric layer is on the seed layer. The top electrode is on the piezoelectric layer. By providing the bottom electrode having the top surface with a roughness between 0.3 nm Ra and 2 nm Ra, the seed layer and the piezoelectric layer may have one or more desired properties such as a desired c-axis tilt that would not otherwise be achievable. Accordingly, the performance of the acoustic device may be improved.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
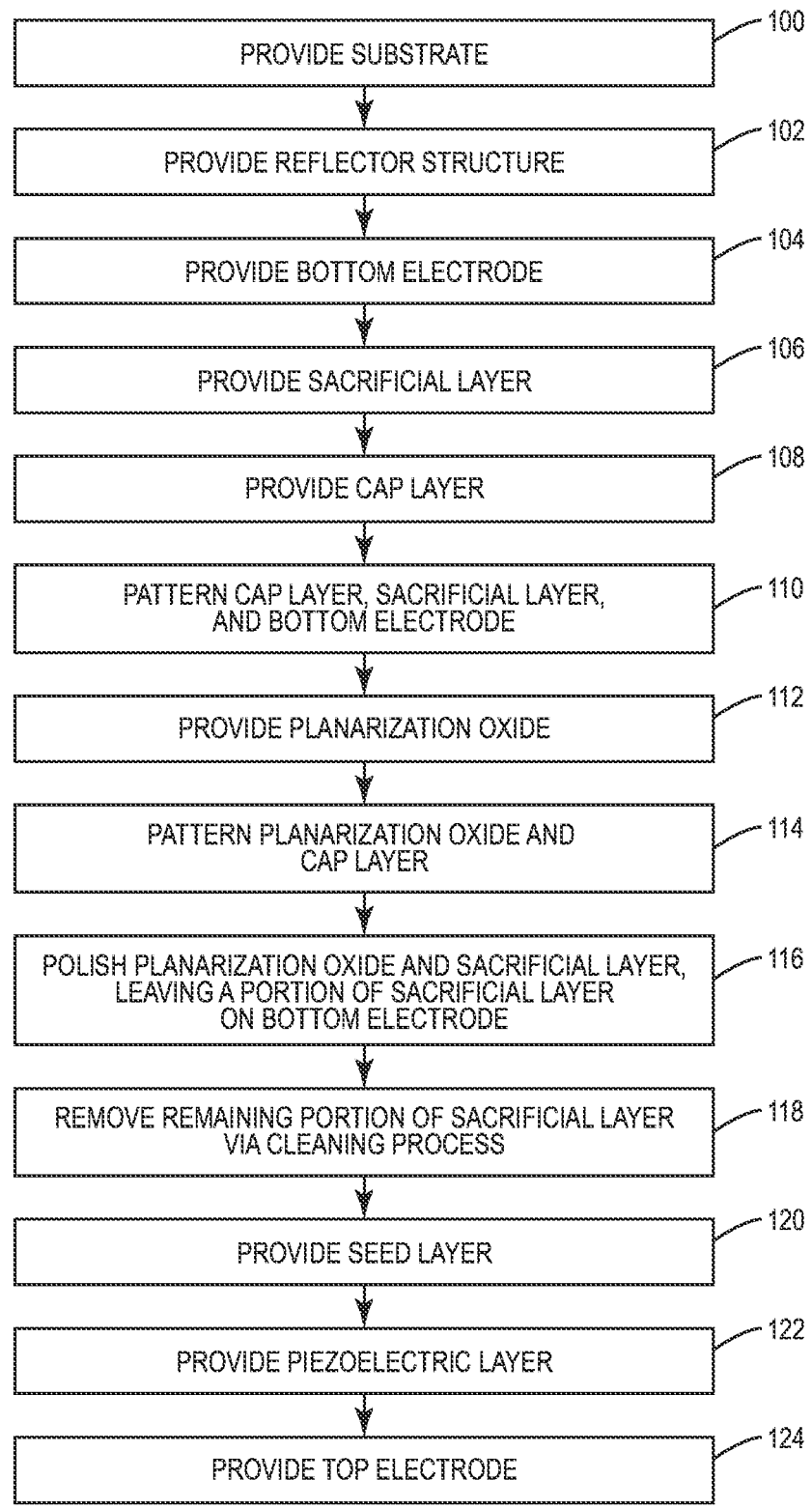
FIG. 1 is a flow chart illustrating a method for manufacturing an acoustic device according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

As discussed above, certain crystallographic orientations of a piezoelectric layer may provide beneficial effects in the performance of an acoustic device such as a bulk acoustic wave (BAW) resonator. Principles of the present disclosure relate to methods for obtaining a desired crystallographic orientation of a piezoelectric layer with a high degree of precision. The principles of the present disclosure are applicable to any type of acoustic devices such as surface acoustic wave (SAW) resonators, BAW resonators, and the like.

FIG. 1 is a flow diagram illustrating a method for manufacturing an acoustic device 10 according to one embodiment of the present disclosure.

Figure 2A:
FIGS. 2A through 2M illustrate a method for manufacturing an acoustic device according to one embodiment of the present disclosure.
Figure 2B:
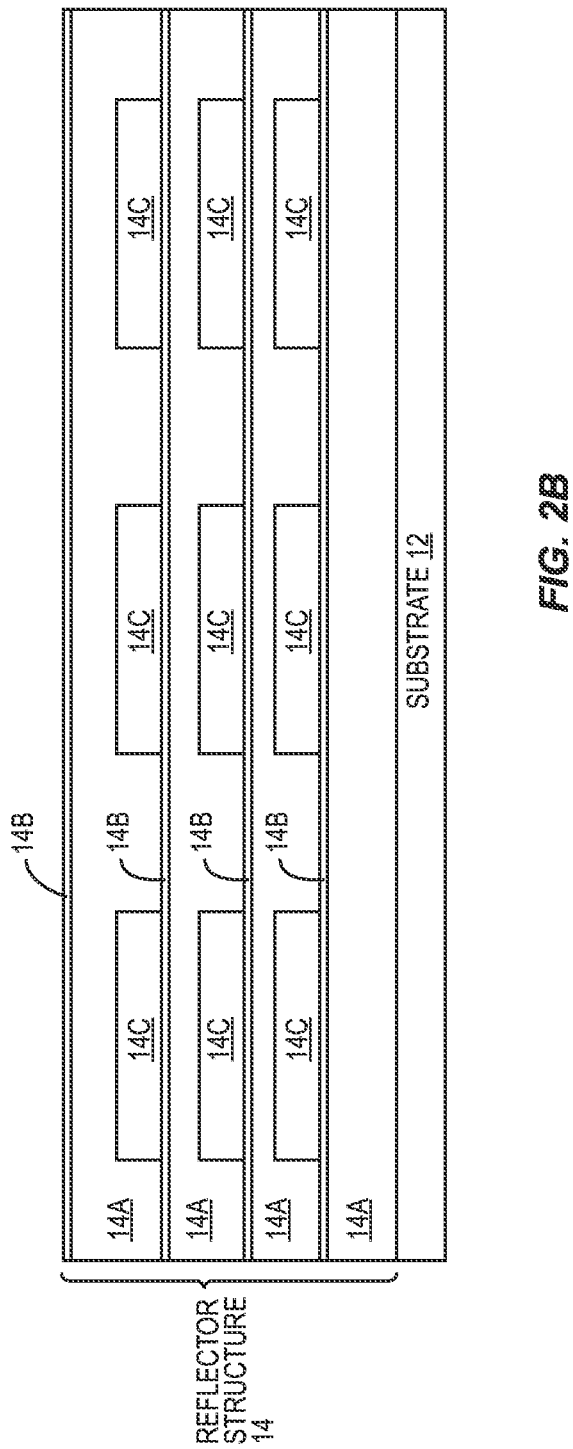

FIGS. 2A through 2M are cross-sectional views of the acoustic device 10 throughout the manufacturing process, and thus are discussed together with FIG. 1. First, a substrate 12 is provided (step 100 and FIG. 2A). The substrate 12 may be any suitable material and thickness for supporting the resultant acoustic device 10. In one embodiment, the substrate 12 comprises silicon and has a thickness between 150 μm and 725 μm. A reflector structure 14 is provided on the substrate 12 (step 102 and FIG. 2B). The reflector structure 14 is shown as a Bragg reflector including alternating layers of materials. In one embodiment, the reflector structure 14 comprises alternating layers of silicon dioxide (shown as 14A), aluminum nitride (shown as 14B), and tungsten (shown as 14C). While a particular reflector structure 14 is shown for purposes of example, those skilled in the art will appreciate that any reflector structure 14 may be used without departing from the principles of the present disclosure. In some embodiments, the reflector structure 14 may be omitted and replaced, for example, with an air cavity, as in the case of a membrane or air-gap thin-film bulk acoustic resonator (FBAR), to which the principles of the present disclosure can be readily applied. The reflector structure 14 may be provided by any suitable deposition process, which may include any number of steps. Details of providing the reflector structure 14 will be readily appreciated by those skilled in the art and thus are not discussed herein.

Figure 2C:
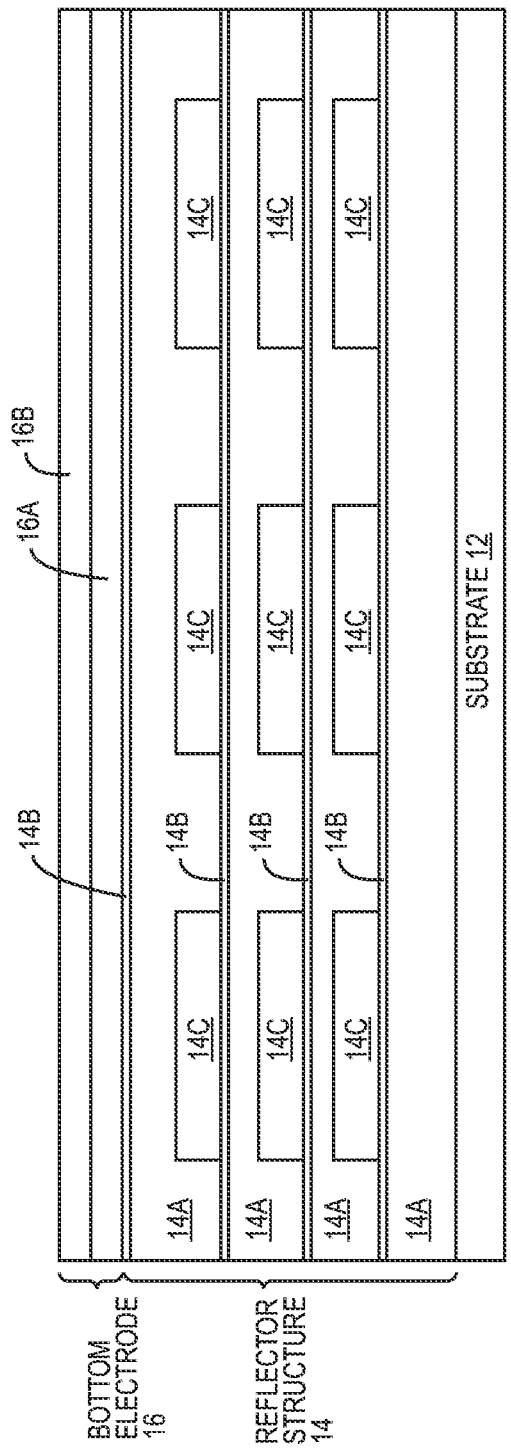

A bottom electrode 16 is provided on the reflector structure 14 (step 104 and FIG. 2C). The bottom electrode 16 may comprise any number of layers of material. In one embodiment, the bottom electrode 16 comprises a first layer of aluminum copper (shown as 16A) and a second layer of tungsten (shown as 16B). However, the bottom electrode 16 may comprise any number of suitable materials. When the reflector structure 14 is not provided, the bottom electrode 16 may be provided directly on the substrate 12 or on any number of different intervening layers on the substrate 12. A thickness of the bottom electrode 16 may be between 500 Angstroms (Å) and 4000 Å. In particular, a thickness of the first layer of aluminum copper may be between 250 Å and 2000 Å, and a thickness of the second layer of tungsten may be between 250 Å and 2000 Å. Notably, the present disclosure contemplates the use of any discrete point or sub-range within the exemplary ranges discussed herein for any of the layers.

Figure 2D:
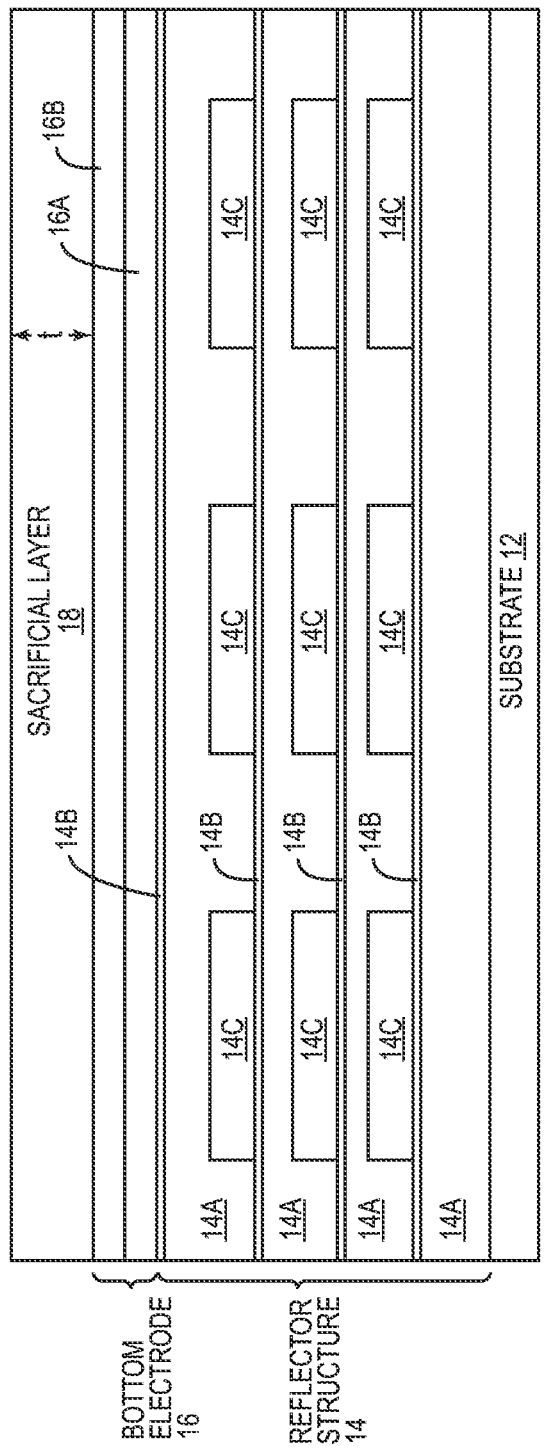

A sacrificial layer 18 is provided on the bottom electrode 16 (step 106 and FIG. 2D). In one embodiment, the sacrificial layer 18 comprises amorphous or polycrystalline aluminum nitride, however, any suitable material may be used for the sacrificial layer 18 without departing from the principles herein. Notably, the sacrificial layer 18 is grown to a thickness t that is between 200 Å and 2000 Å. As discussed in detail below, providing the sacrificial layer 18 such that the thickness t is between 200 Å and 2000 Å provides a buffer that protects the bottom electrode 16 during a polishing process so as to maintain a surface roughness of the bottom electrode 16 that promotes the growth of a piezoelectric layer having a desired crystallographic orientation.

Figure 2E:
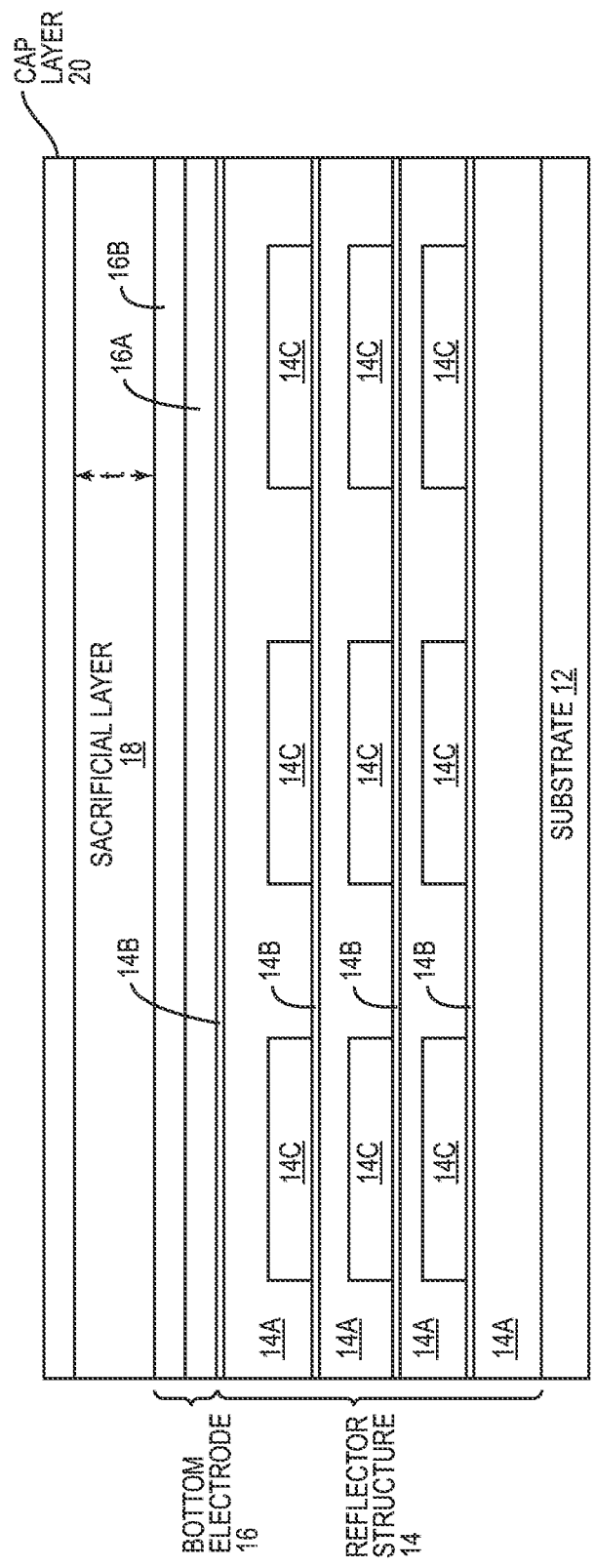

A cap layer 20 is provided on the sacrificial layer 18 (step 108 and FIG. 2E). In one embodiment, the cap layer 20 comprises silicon dioxide, however, any suitable material may be used for the cap layer 20. A thickness of the cap layer 20 may be between 100 Å and 1000 Å.

Figure 2F:
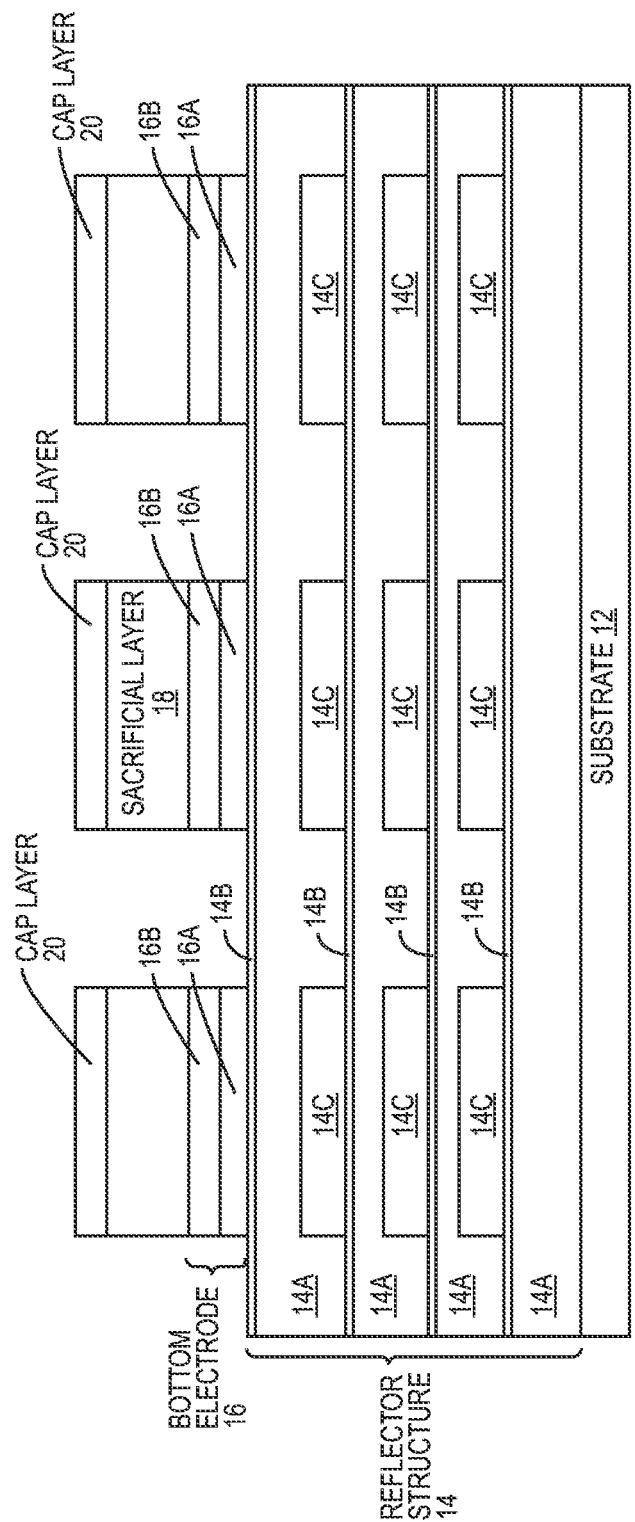

The cap layer 20, the sacrificial layer 18, and the bottom electrode 16 are then patterned (step 110 and FIG. 2F). The cap layer 20, the sacrificial layer 18, and the bottom electrode 16 may be patterned by any suitable process such as a photolithography patterning process. The details of patterning the cap layer 20, the sacrificial layer 18, and the bottom electrode 16 will be readily appreciated by those skilled in the art and thus are not discussed in detail herein.

Figure 2G:
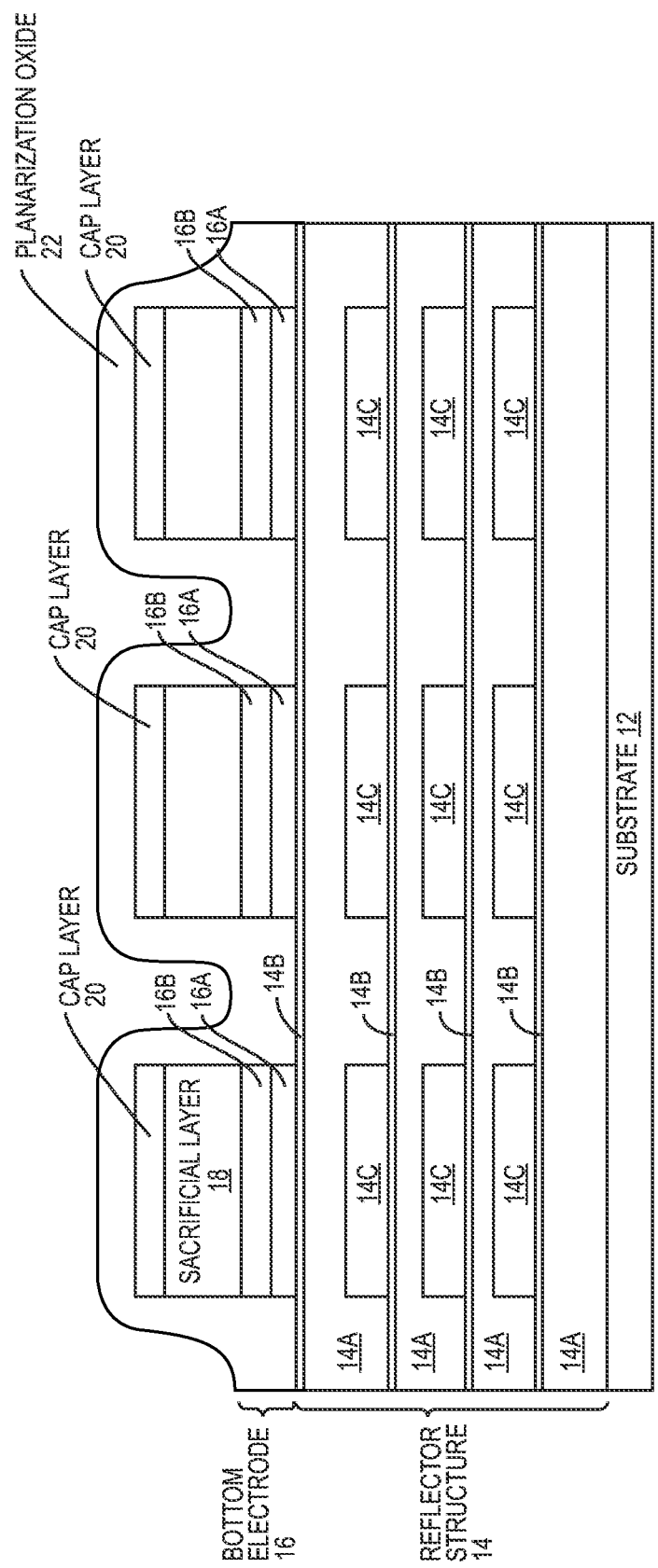
Figure 2H:
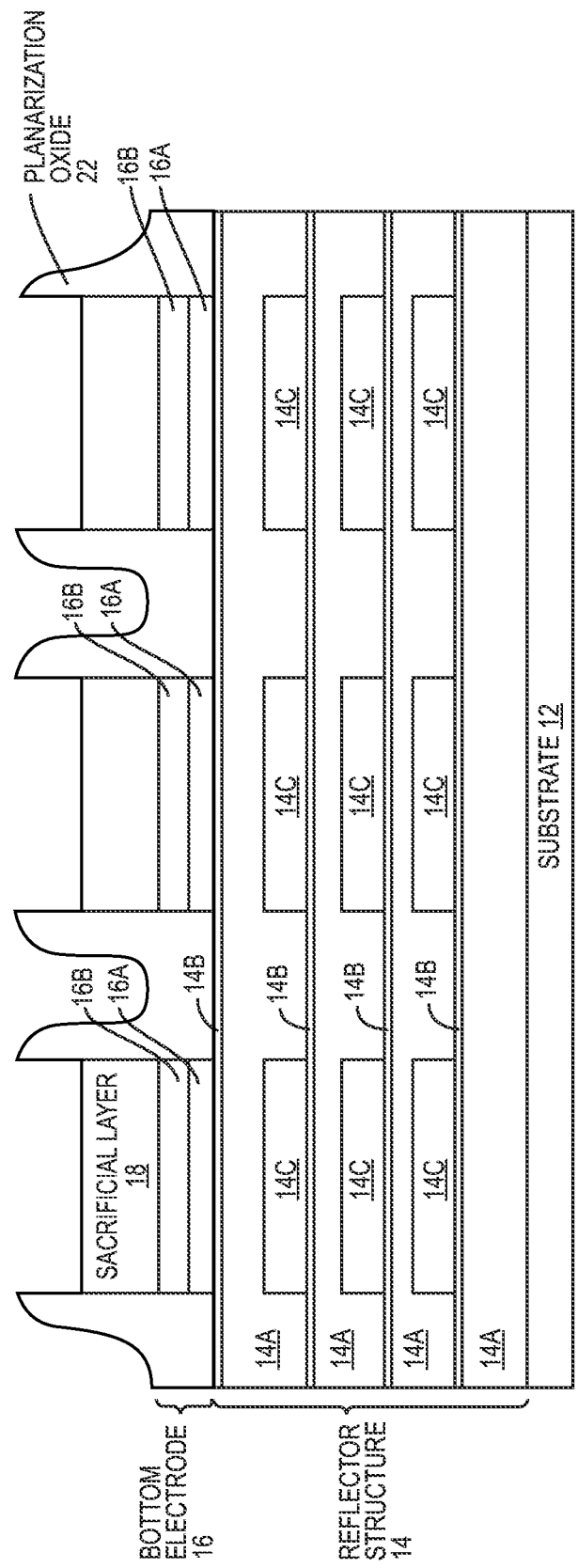
Figure 2I:
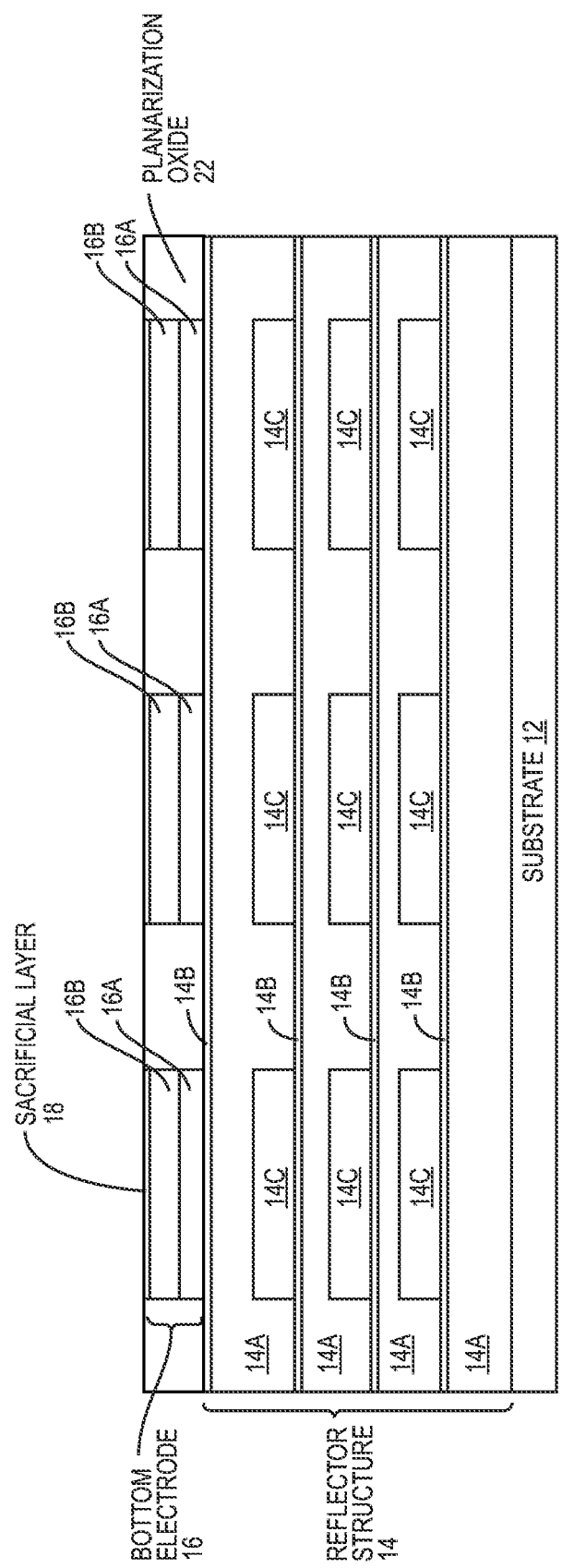

A planarization oxide 22 is provided on the exposed portions of the reflector structure 14, the bottom electrode 16, the sacrificial layer 18, and the cap layer 20 (step 112 and FIG. 2G). In one embodiment, the planarization oxide 22 comprises silicon dioxide. The planarization oxide 22 may have a thickness between 200 Å and 4400 Å. Notably, the planarization oxide 22 may be provided having a thickness calibrated to provide a certain amount of buffer material between a top surface thereof and the bottom electrode 16 such that the top surface of the planarization oxide 22 is used for calibration during a polishing process as discussed below.

The planarization oxide 22 and the cap layer 20 are patterned (step 114 and FIG. 2H) such that the sacrificial layer 18 is exposed through one or more openings in the planarization oxide 22. The planarization oxide 22 and the sacrificial layer 18 are then polished (step 116 and FIG. 2I). The planarization oxide 22 and the sacrificial layer 18 may be polished using any suitable process. In one embodiment, the planarization oxide 22 and the sacrificial layer 18 are polished using a chemical-mechanical polishing (CMP) process. Notably, the polishing is performed such that a portion of the sacrificial layer 18 remains on the bottom electrode 16. In a conventional manufacturing process for an acoustic device, the sacrificial layer 18 is polished all the way through such that a top surface of the bottom electrode 16 is also polished. This results in a very smooth top surface of the bottom electrode 16, which may be disadvantageous for subsequent growth of a piezoelectric layer. By leaving a portion of the sacrificial layer 18 on the bottom electrode 16, the surface roughness of the bottom electrode 16 can be maintained at a desired level, leading to improved control over the subsequent growth of a piezoelectric layer as discussed below. Due to the limited selectivity of CMP processes, the thickness of the sacrificial layer 18 and the planarization oxide 22 are adjusted such to maintain the portion of the sacrificial layer 18 on the bottom electrode 16 during the process. However, this is not required if a polishing process with a very high degree of selectivity is developed and/or used.

Figure 2J:
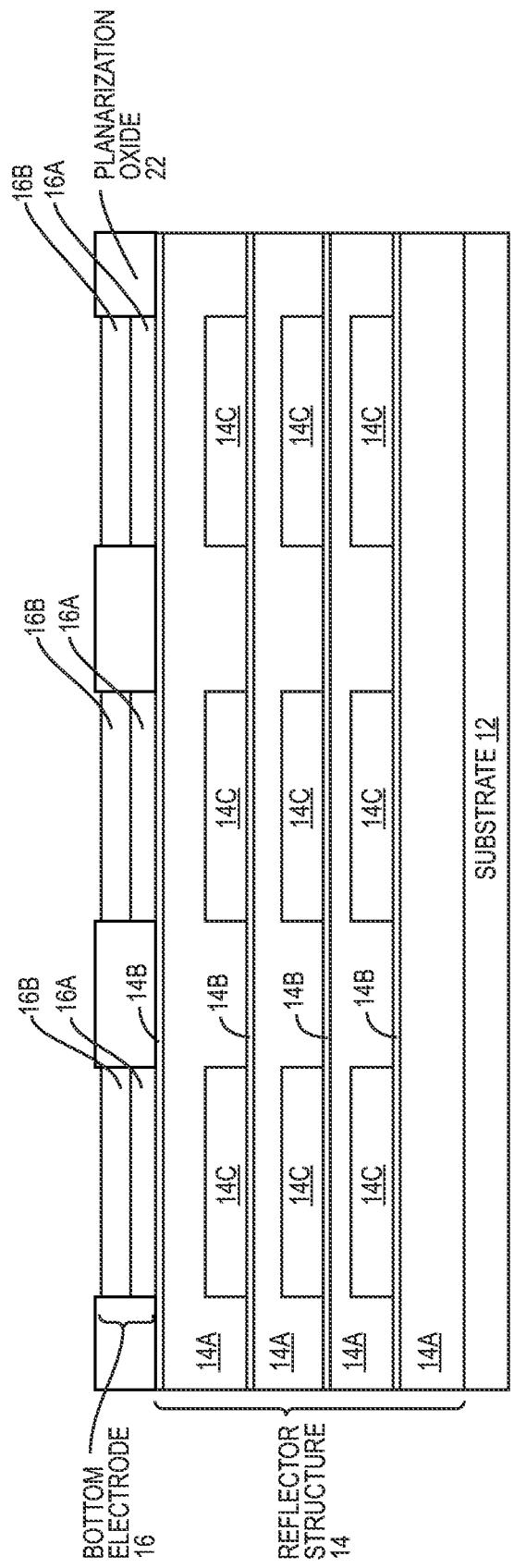

The remaining portion of the sacrificial layer 18 is removed in a cleaning process (step 118 and FIG. 2J). Any suitable cleaning process which maintains the surface roughness of the bottom electrode 16 may be used. In one embodiment, a scrubber cleaning process is used to remove the remaining portion of the sacrificial layer 18 while maintaining the surface roughness of the bottom electrode 16. The cleaning process may etch away the remaining portion of the sacrificial layer 18 rather than mechanically polishing it away, which may prevent unnecessary smoothing of the surface of the bottom electrode 16.

The roughness of the surface of the bottom electrode 16 after removal of the sacrificial layer 18 is important for determining the crystallographic orientation and quality of a subsequently grown piezoelectric layer on the bottom electrode 16. If the surface of the bottom electrode 16 is too smooth (e.g., root mean square (RMS) average of profile height deviations from the mean line less than 2 nm), particles contacting the surface of the bottom electrode 16 during a subsequent deposition step will shift in position as they contact the surface and grow in undesired crystallographic orientations. The surface roughness of the bottom electrode 16 is at a desired amount when deposited. Accordingly, by tailoring the manufacturing process to minimally degrade the surface roughness of the bottom electrode 16 as applied, desired qualities of the subsequently grown piezoelectric layer can be maintained. In various embodiments, the principles discussed herein enable a surface roughness of the bottom electrode 16 between 0.3 nm Ra and 2 nm Ra after removal of the sacrificial layer 18. In some embodiments, an additional step which includes increasing the surface roughness of the bottom electrode 16 (e.g., via a process such as ion milling, sputtering, etc.) may be performed after removal of the sacrificial layer 18. Notably, the present disclosure contemplates the use of any discrete point or sub-range within the exemplary given range for the surface roughness of the bottom electrode 16 herein.

Figure 2K:
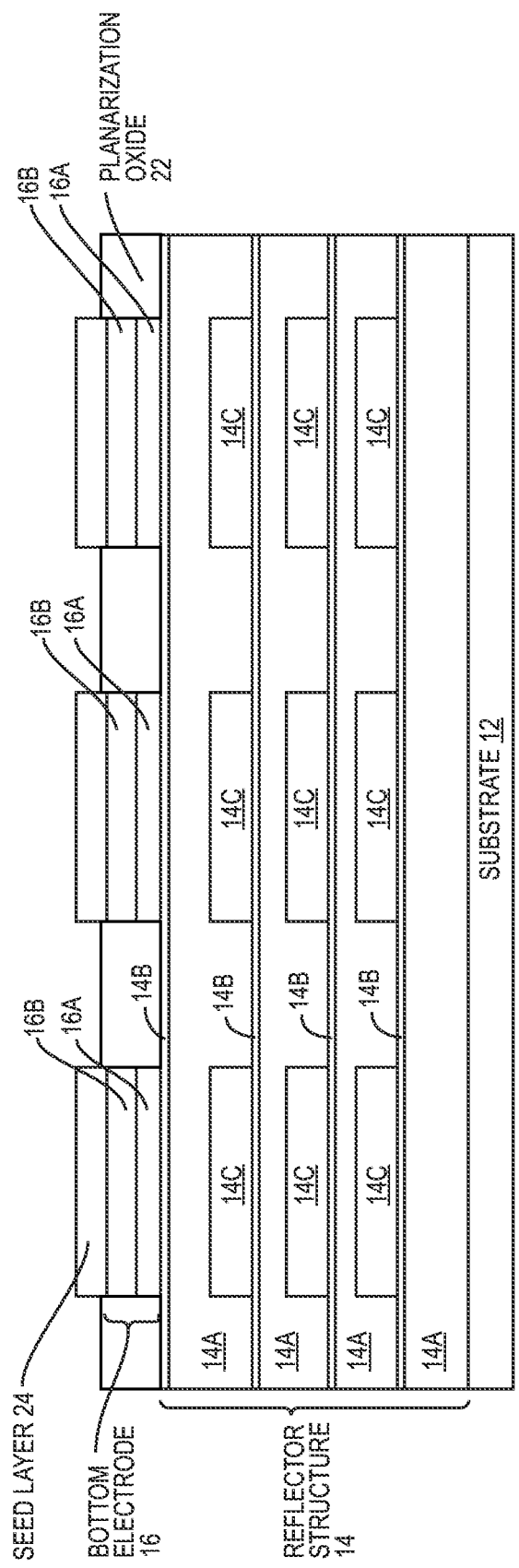

A seed layer 24 is grown on the bottom electrode 16 (step 120 and FIG. 2K). In one embodiment, the seed layer 24 comprises aluminum nitride, however, the seed layer 24 can comprise any suitable piezoelectric material. Notably, the seed layer 24 is grown in an off-axis deposition process wherein deposited particles impact the bottom electrode 16 at a predetermined angle with respect to a normal angle from a surface of the substrate 12. Depositing the seed layer 24 in this manner results in a desired c-axis tilt of the seed layer 24. The surface roughness of the bottom electrode 16 is crucial for providing said c-axis tilt of the seed layer 24 at a desired amount. As discussed above, if the surface of the bottom electrode 16 is too smooth, particles contacting the bottom electrode 16 during deposition can shift in position as they glide along the surface of the bottom electrode 16, leading to unpredictable and/or undesired crystalline growth patterns. In one embodiment, a c-axis tilt of the seed layer 24 with respect to a surface plane of the bottom electrode 16 is between 8° and 35°. A thickness of the seed layer 24 may be between 900 Å and 1500 Å. Notably, the present disclosure contemplates the use of any discrete point or sub-range within the exemplary range for the c-axis tile of the seed layer 24 herein.

Figure 2L:
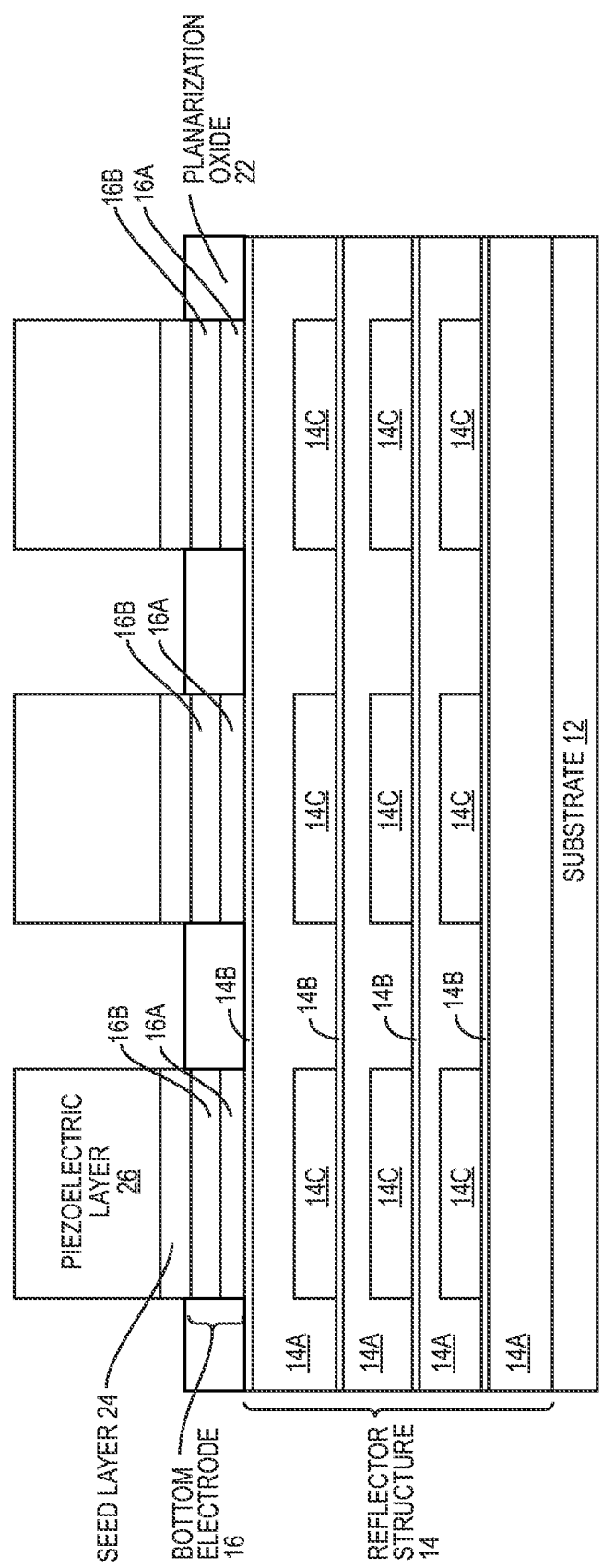

A piezoelectric layer 26 is grown on the seed layer 24 (step 122 and FIG. 2L). In one embodiment, the piezoelectric layer 26 comprises aluminum nitride, however, the piezoelectric layer 26 may comprise any suitable piezoelectric material. In one embodiment, the piezoelectric layer 26 is grown in a normal-axis deposition process wherein deposited particles impact the seed layer 24 at a normal angle with respect to a surface plane of a normal angle from a surface of the substrate 12. In other embodiments, the piezoelectric layer 26 may be grown in an off-axis deposition process wherein deposited particles impact the seed layer 24 at a predetermined angle with respect to a normal angle from a surface of the substrate 12. This angle may be the same or different than the angle used for the deposition process of the seed layer 24. Due to the crystalline orientation of the seed layer 24 however, the piezoelectric layer 26 also grows having a c-axis tilt that is not normal to the surface plane of the bottom electrode 16. In one embodiment, a c-axis tilt of the piezoelectric layer 26 with respect to a surface plane of the bottom electrode 16 is between 8° and 35°. A thickness of the piezoelectric layer 26 may be between 2000 Å and 5000 Å. Notably, the present disclosure contemplates the use of any discrete point or sub-range within the exemplary range for the c-axis tilt of the piezoelectric layer 26 herein.

Figure 2M:
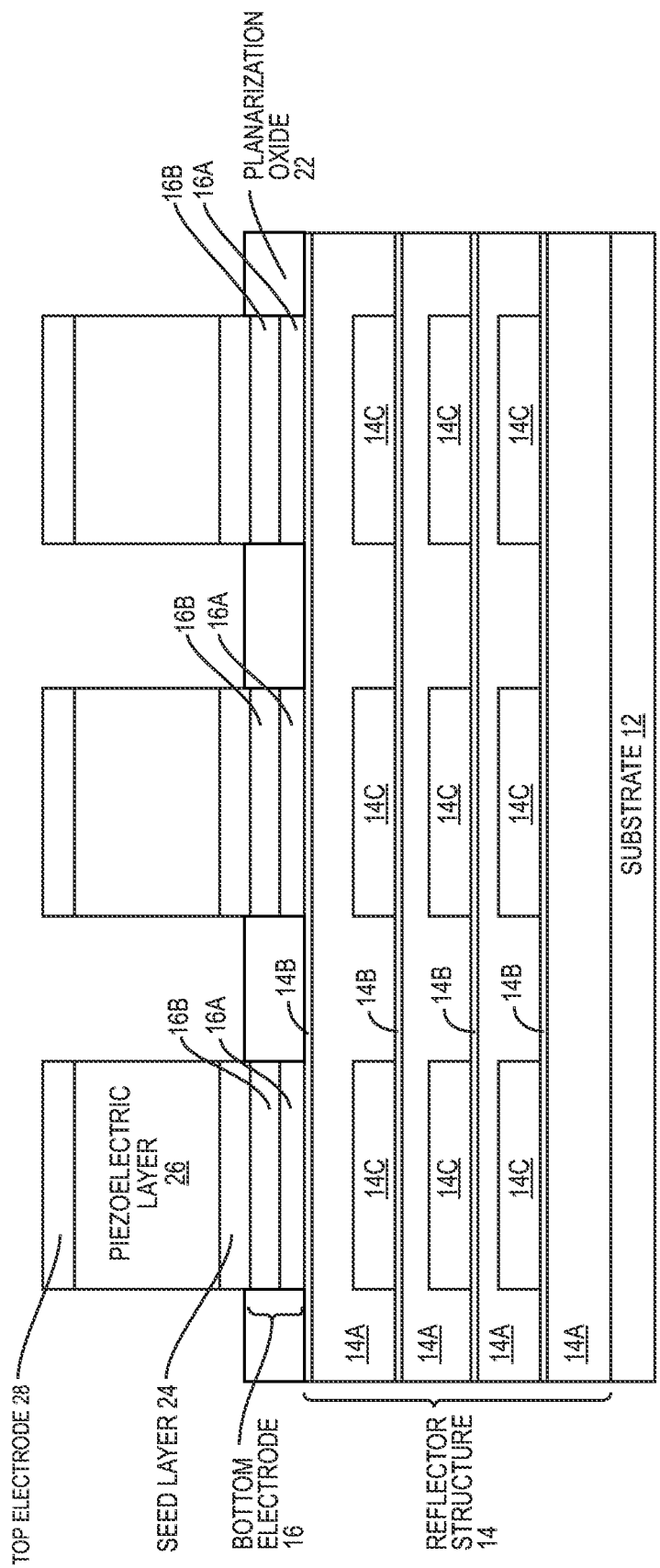

A top electrode 28 is provided on the piezoelectric layer 26 (step 124 and FIG. 2M). The top electrode 28 may be provided by any suitable deposition and/or patterning steps. In one embodiment, the top electrode 28 may comprise tungsten, or multiple layers including tungsten and one or more other suitable metals.

Due to the maintenance of the surface roughness of the bottom electrode 16 and the off-axis deposition processes used for the seed layer 24 (and in some embodiments the piezoelectric layer 26), the resulting piezoelectric layer 26 has a desired crystallographic orientation, specifically with regard to the c-axis tilt thereof. The resulting acoustic device 10 may thus have improved performance in a number of different domains. For example, the principles discussed herein may enable an inductance of the acoustic device 10 greater than 0.5 times the value reflection coefficient imaginary component. Further, the principles discussed herein may enable a sensitivity greater than 84000 MHz/ng/sqµm.

The resulting acoustic device 10 may be used in a variety of applications. In various embodiments, the acoustic device 10 can be used as a resonator, which may provide functions such as sensing one or more desired signals (e.g., in liquid environments). Notably, the acoustic device 10 discussed herein is merely exemplary. The principles of the present disclosure can apply to any acoustic device wherein a piezoelectric layer contacts an electrical contact.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method for manufacturing an acoustic device comprising:
   providing a substrate;
   providing a bottom electrode over the substrate;
   providing a sacrificial layer on the bottom electrode;
   patterning the bottom electrode and the sacrificial layer;
   polishing the sacrificial layer such that a portion of the sacrificial layer remains on the bottom electrode; and
   removing the remaining portion of the sacrificial layer via a cleaning process such that a surface roughness of the bottom electrode is maintained.

2. The method of claim 1 further comprising:
   providing a seed layer on the bottom electrode; and
   providing a piezoelectric layer on the seed layer.

3. The method of claim 2 wherein:
   the seed layer is deposited via an off-axis deposition process wherein deposited particles impact the bottom electrode at a predetermined angle with respect to a surface plane of the bottom electrode; and
   the piezoelectric layer is deposited via a normal-axis deposition process wherein deposited particles impact the seed layer at a normal angle with respect to a surface plane of the seed layer.

4. The method of claim 2 further comprising providing a top electrode on the piezoelectric layer.

5. The method of claim 2 wherein:
   the sacrificial layer comprises aluminum nitride;
   the bottom electrode comprises a layer of aluminum copper and a layer of tungsten on the layer of aluminum copper; and
   the seed layer and the piezoelectric layer comprise aluminum nitride.

6. The method of claim 2 further comprising providing a reflector structure between the substrate and the bottom electrode.

7. The method of claim 6 wherein the reflector structure comprises alternating layers of aluminum nitride, silicon dioxide, and tungsten.

8. The method of claim 2 wherein after the cleaning process the surface roughness of the bottom electrode is between 0.5 nm Ra and 2 nm Ra.

9. The method of claim 2 wherein the sacrificial layer is provided having a thickness between 300 Å and 2000 Å.

10. The method of claim 2 wherein a c-axis tilt of the piezoelectric layer is between 8° and 35°.

11. The method of claim 1 wherein after the cleaning process the surface roughness of the bottom electrode is between 0.5 nm Ra and 2 nm Ra.

12. The method of claim 1 wherein the sacrificial layer is provided having a thickness between 300 Å and 2000 Å.

13. The method of claim 1 further comprising providing a cap layer on the sacrificial layer before patterning the bottom electrode and the sacrificial layer.

14. The method of claim 1 further comprising providing a planarization oxide on the exposed portions of the bottom electrode and the sacrificial layer before polishing the bottom electrode and the sacrificial layer.

15. An acoustic device comprising:
   a substrate;
   a bottom electrode, the bottom electrode comprising a top surface having a roughness between 0.3 nm Ra and 2 nm Ra;
   a seed layer on the top surface of the bottom electrode;
   a piezoelectric layer on the seed layer, wherein a c-axis tilt of the piezoelectric layer is between 8° and 35° relative to a plane of the top surface of the bottom electrode; and
   a top electrode on the piezoelectric layer.

16. The acoustic device of claim 15 further comprising a reflector structure between the substrate and the bottom electrode.

17. The acoustic device of claim 15 wherein:
   the bottom electrode comprises a layer of aluminum copper and a layer of tungsten on the layer of aluminum copper; and
   the seed layer and the piezoelectric layer comprise aluminum nitride.

18. The acoustic device of claim 15 wherein the seed layer comprises a piezoelectric material.

19. The acoustic device of claim 15 comprising an inductance greater than 0.5 times a value reflection coefficient imaginary component of the acoustic device.

20. The acoustic device of claim 15 comprising a sensitivity greater than 84000 MHz/ng/sqµm.

* * * * *